United States Patent
Ebrom et al.

(10) Patent No.: US 9,933,131 B2
(45) Date of Patent: Apr. 3, 2018

(54) INTEGRATED CONSOLE DISPLAY ASSEMBLY

(71) Applicant: WHIRLPOOL CORPORATION, Benton Harbor, MI (US)

(72) Inventors: Matthew P. Ebrom, Holland, MI (US); Eric J. Schuh, Stevensville, MI (US); Sithaarth T. Subramaniyam, Saint Joseph, MI (US); Sugosh Venkataraman, Stevensville, MI (US); Shivayogi Annigeri, Karnataka (IN); Michael E. Gatt, Saint Joseph, MI (US); Ajay Ram Narayana Pillai, St. Joseph, MI (US); Mihir Ponkshe, Pune (IN)

(73) Assignee: Whirlpool Corporation, Benton Harbor, MI (US)

(*) Notice: Subject to any disclaimer, the term of this patent is extended or adjusted under 35 U.S.C. 154(b) by 52 days.

(21) Appl. No.: 15/058,755

(22) Filed: Mar. 2, 2016

(65) Prior Publication Data
US 2016/0178160 A1 Jun. 23, 2016

Related U.S. Application Data

(63) Continuation-in-part of application No. 14/065,721, filed on Oct. 29, 2013, now abandoned.

(51) Int. Cl.
*F21V 23/06* (2006.01)
*F21V 7/04* (2006.01)
(Continued)

(52) U.S. Cl.
CPC ............. *F21V 7/04* (2013.01); *F21V 23/005* (2013.01); *F21V 23/06* (2013.01);
(Continued)

(58) Field of Classification Search
CPC .................................. G09F 9/33; G09F 9/302
(Continued)

(56) References Cited

U.S. PATENT DOCUMENTS 3,858,341 A 1/1975 Wakabayashi
4,818,980 A 4/1989 Strosser et al.
(Continued)

FOREIGN PATENT DOCUMENTS

EP 2481602 A1 8/2012
EP 2869675 A1 5/2015

OTHER PUBLICATIONS

New Appliance Panel Decorating Solutions at http://digital.bnpmedia.com/article/New+Appliance+Panel+Decorating+Solutions/1264696/0/article.html, appliance DESIGN, John Kaverman, Jan. 2013.

*Primary Examiner* — Kristina N Junge

(57) ABSTRACT

In one aspect, a device has a controller and a fascia assembly, with a fascia, and a printed circuit board (PCB) mounted to the fascia. The PCB has a plurality of holes, and a plurality of light emitting diodes (LEDs), wherein one LED is mounted adjacent to each hole. The device also includes a wiring harness coupling the controller to the PCB wherein the LEDs may be energized according to signals received from the controller; and a console adjacent the PCB. The console has a plurality of light reflecting cups arranged therein so that each light reflecting cup covers an LED and the adjacent hole to reflect light from the LEDs through the holes so that the light is visible through the fascia assembly.

19 Claims, 4 Drawing Sheets

(51) Int. Cl.
*F21V 23/00* (2015.01)
*F21V 33/00* (2006.01)
*H05K 1/02* (2006.01)
*F24C 7/08* (2006.01)
*F21W 131/305* (2006.01)
*F21W 131/307* (2006.01)

(52) U.S. Cl.
CPC .......... *F21V 33/0044* (2013.01); *F24C 7/082* (2013.01); *H05K 1/0274* (2013.01); *F21W 2131/305* (2013.01); *F21W 2131/307* (2013.01); *H05K 2201/09063* (2013.01); *H05K 2201/09072* (2013.01); *H05K 2201/10106* (2013.01); *H05K 2201/10128* (2013.01)

(58) Field of Classification Search
USPC .................................................. 40/451, 450
See application file for complete search history.

(56) References Cited

U.S. PATENT DOCUMENTS

| | | |
|---|---|---|
| 4,990,772 A | 2/1991 | Rosenthal |
| 5,105,568 A | 4/1992 | Branning |
| 5,521,345 A | 5/1996 | Wulc |
| 5,579,597 A * | 12/1996 | Stewart ................ G09F 9/3023 362/613 |
| 5,833,903 A | 11/1998 | Centofante |
| 6,137,224 A | 10/2000 | Centofante |
| 6,280,054 B1 | 8/2001 | Cassarly et al. |
| 6,508,562 B1 | 1/2003 | Venkatram et al. |
| 6,617,786 B1 | 9/2003 | Centofante |
| 7,517,103 B2 | 4/2009 | Furuya et al. |
| 7,968,795 B2 | 6/2011 | Yang |
| 8,530,742 B2 | 9/2013 | Hite et al. |
| 9,035,178 B2 | 5/2015 | Gerstner et al. |
| 9,220,394 B2 | 12/2015 | Heater et al. |
| 2002/0024808 A1 | 2/2002 | Suehiro et al. |
| 2003/0002281 A1 | 1/2003 | Suehiro |
| 2004/0201495 A1* | 10/2004 | Lim ................ G08G 1/096716 340/905 |
| 2011/0181516 A1 | 7/2011 | Mallory et al. |
| 2015/0049455 A1 | 2/2015 | Heater et al. |
| 2015/0113841 A1 | 4/2015 | Ebrom et al. |

\* cited by examiner

INTEGRATED CONSOLE DISPLAY ASSEMBLY

CROSS REFERENCE TO RELATED APPLICATIONS

This application is a continuation-in-part of U.S. application Ser. No. 14/065,721 filed Oct. 29, 2013.

BACKGROUND OF THE INVENTION

Home appliances are increasingly equipped with a greater number of user-selectable features, typically presented via a user interface. An appliance may have a console assembly with the user interface or control panel provided thereon for selecting or setting one or more of the user-selectable features. The user interface may be coupled to a controller. The console assembly may include illuminated display elements that encode and present information to the user.

BRIEF DESCRIPTION

In one aspect, an embodiment of the disclosed technology relates to a device having a controller and a fascia assembly. The fascia assembly includes a fascia, and a printed circuit board (PCB) mounted to the fascia. The PCB has a plurality of holes extending through a surface thereof between a front side and a rear side of the surface, and a plurality of light emitting diodes (LEDs) mounted to the rear side, wherein one LED is mounted adjacent to each hole. The device also includes a wiring harness coupling the controller to the PCB wherein the LEDs may be energized according to signals received from the controller; and a console adjacent the PCB. The console has a plurality of light reflecting cups arranged therein so that each light reflecting cup covers the one LED and the adjacent hole, and is spaced from the one LED and the adjacent hole to reflect light from the LEDs through the holes so that the light is visible through the fascia assembly.

DESCRIPTION OF EMBODIMENTS OF THE INVENTION

Figure 1:
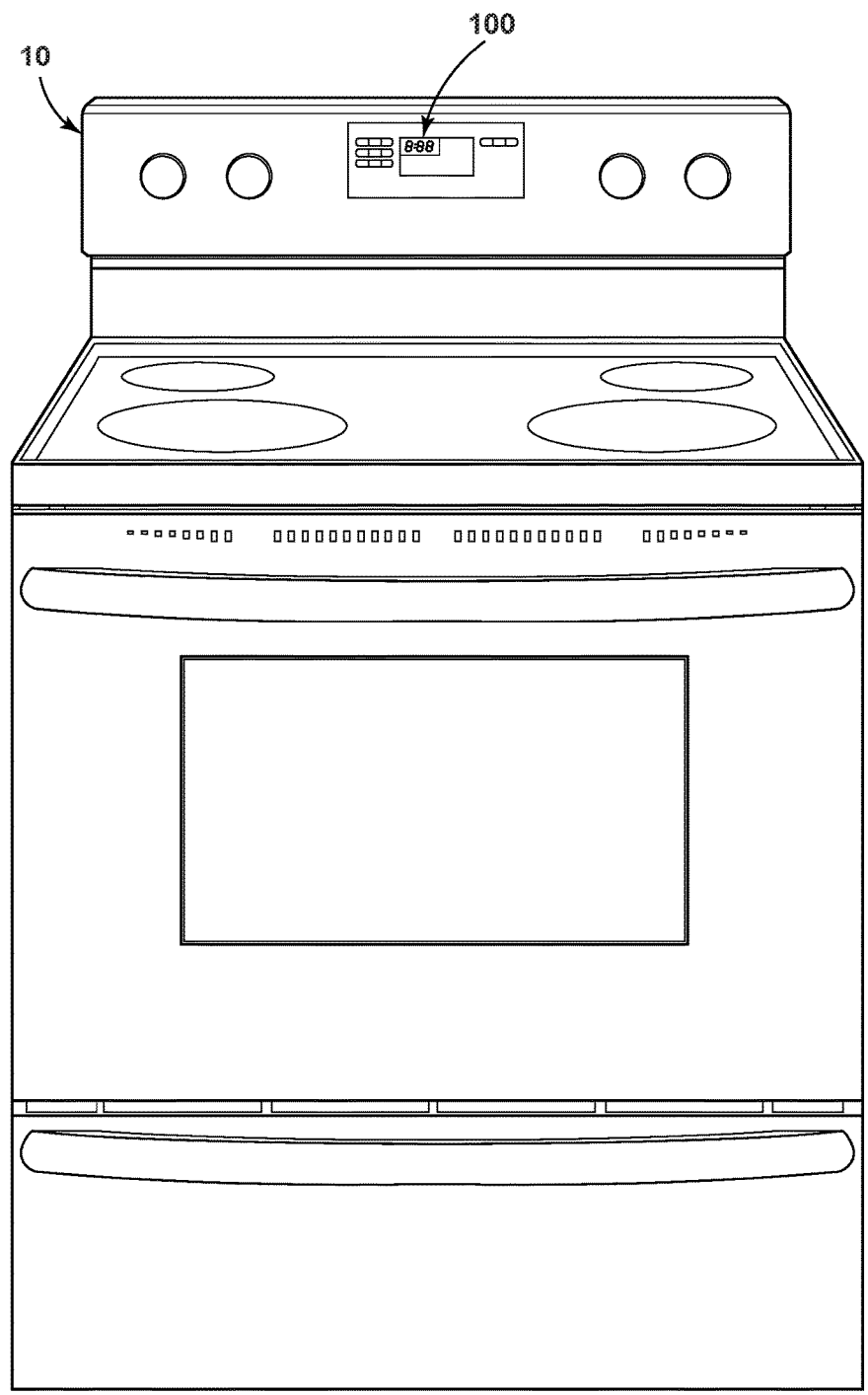
FIG. 1 depicts a front perspective view of an appliance in the form of a range having an example embodiment of the alphanumeric display assembly.

FIG. 1 depicts a front perspective view of an appliance in the form of a range 10 having an example embodiment of an alphanumeric display assembly 100. As illustrated, the appliance 10 may be a range, although the alphanumeric display assembly 100 may be included in other types of appliances, non-limiting examples of which may include clothes dryers, laundry drying machines, tumbling or stationary refreshing/revitalizing machines, extractors, non-aqueous washing apparatus, dishwashers, refrigerators, freezers, conventional ovens, microwave ovens, stoves, beverage dispensers, and washing machines. The alphanumeric display assembly also may be used in environments other than household appliances and generally applies to any electronic display of alphanumeric indicia, such as clocks, timers, calculators, enumerators, and the like.

The alphanumeric display assembly 100 is a type of display that includes an array of segments that may be independently illuminated. The segments of the display may be illuminated in different combinations. The combinations of illuminated segments are selected to produce numerals or letters.

Figure 2:
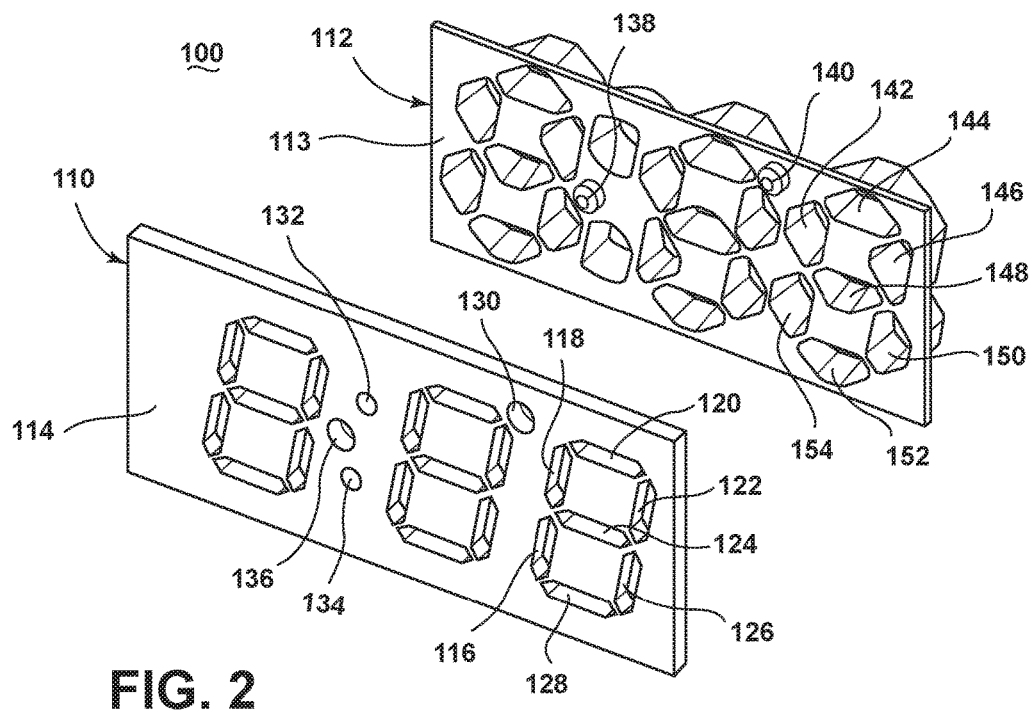
FIG. 2 depicts an exploded perspective view of the front of the alphanumeric display assembly of FIG. 1.

FIG. 2 depicts an exploded perspective view of the front of the alphanumeric display assembly 100 of FIG. 1. The alphanumeric display assembly 100 includes a printed circuit board (PCB) 110 and a light reflector 112. With respect to the viewable side of the alphanumeric display assembly 100, the light reflector 112 is placed behind the PCB 110.

The PCB 110 has a front side 114 that includes a plurality of holes 116-128, 132 and 134 extending through the PCB 110. The holes 116-128 are arranged to form an alphanumeric indicium (sometime commonly referred to as a 7-segment display, where each hole forms a segment of the alphanumeric indicium). In most applications, the segments (formed from the holes 116-128) are of nearly uniform shape and size and are usually formed as elongated hexagons, though trapezoids and rectangles may alternatively be used. As shown, there may be more than one alphanumeric indicium to complete the display, such as three indicia to display three numerals or letters, each alphanumeric indicium being identical to the others as disclosed herein. The holes 132, 134 are arranged to form a colon, as for use in a clock display. One or more holes may be disposed to form a decimal, as for use in a calculator. Additional holes in the PCB such as bores 130, 136 may aid in the attachment of the light reflector 112 to the PCB 110.

The PCB 110 may include multi-layered circuits with electric components such as integrated circuits (ICs), capacitors, resistors, or inductors, mounted on or embedded into the multi-layered circuits. As described below, the PCB may also include one or more illumination devices including light emitting diodes (LEDs), liquid crystal displays (LCDs) or vacuum fluorescent displays (VFDs). Additional elements may be mounted to PCB 110. For example, one or more touch circuits (not shown) may be mounted to the front side 114 of the PCB 110.

The light reflector 112 may be positioned adjacent to the PCB 110 for directing illumination towards the user. As illustrated, the light reflector 112 may be disposed immediately adjacent to the PCB 110. Preferably, the light reflector 112 is a molded thermoplastic. Other compositions of materials for the light reflector 112 are contemplated and include, but are not limited to: stamped metal, highly reflective aluminized polyethylene terephthalate (PET), molded or formed glass, plate glass, dielectric mirrors, reflective plastic or any other material. Additionally, the material may be coated in whole or in part with one or more reflective materials that may include sputtered aluminum powder, silver coating, silkscreen, metal deposition, reflective paint, etc.

The light reflector 112 may include a first side 113 where a plurality of light cups 140-154 may be disposed on the first side 113 of the light reflector 112. The light cups 140-154 may be in the form of an extruded multi-faceted cavity, each positioned to enclose one of the plurality of holes 116-128, 132 and 134 extending through the PCB 110 and a corresponding illumination device described below. Each of the plurality of holes 116-128, 132 and 134 and its corresponding illumination device is received in the space defined by one of the three dimensional light cups 140-154 when the light reflector 112 is aligned to the PCB 110.

The reflecting cups may comprise acrylonitrile butadiene styrene (ABS). Another material such as polypropylene (PP), polycarbonate (PC), or polystyrene (PS) may be used for the light reflector 112. Also, the reflecting cups may include flame retardant acrylonitrile butadiene styrene (FR ABS), Polyvinyl Chloride (PVC), or flame retardant polycarbonate/acrylonitrile butadiene styrene (FR PC-ABS).

The light reflector 112 may further include one or more bosses 138, 140 to be used as fasteners. The aforementioned bores 130, 136 may receive the bosses 140, 138 respectively and effect a connection to secure the light reflector 112 to the PCB 110. The light reflector 112 is mounted to the rear side of the PCB and may be secured by the fastener connection that includes the bosses 140, 138 received in the bores 130, 136. Other mounting techniques are contemplated and may include welding, adhesive, soldering onto metal leads that are molded onto the light reflector 112. Alternatively, the light reflector 112 may be packaged in a tape-and-reel mechanism and mounted into position by a pick-and-place machine.

Figure 3:
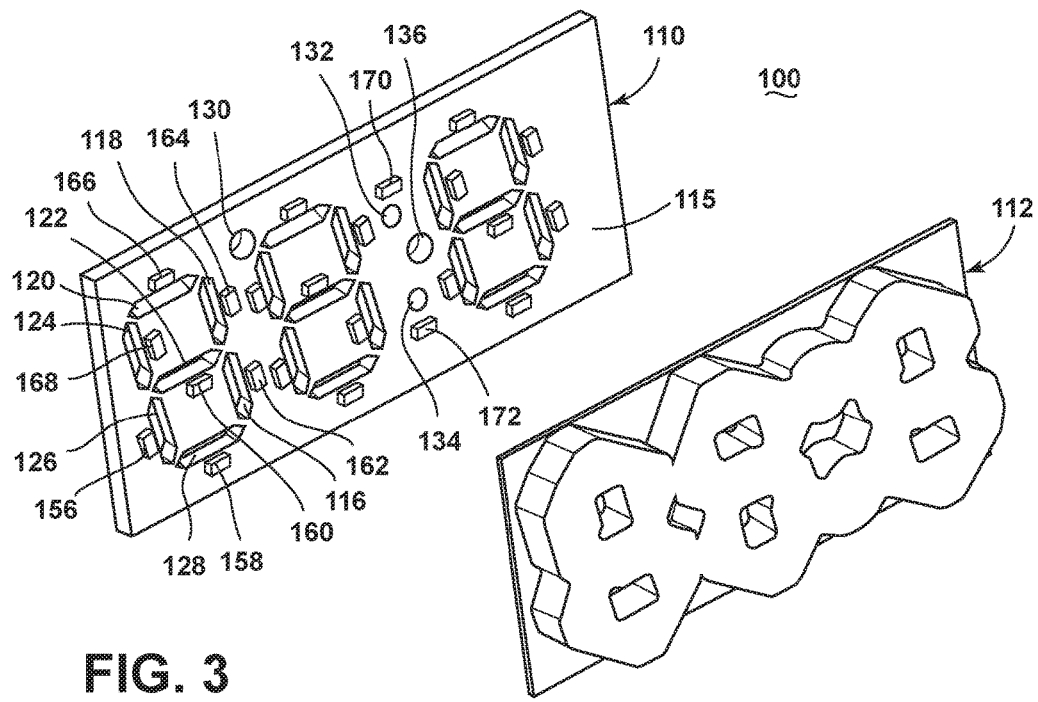
FIG. 3 depicts an exploded perspective view of the rear of the alphanumeric display assembly of FIG. 1.

FIG. 3 depicts an exploded perspective view of the rear of the alphanumeric display assembly 100 of FIG. 1. Mounted to the rear side 115 of the PCB 110, a plurality of LEDs 156-172 are configured such that at least one LED is mounted adjacent to each hole 116-128, 132 and 134. Each light reflecting cup covers at least one LED and the adjacent hole. In this way, each light reflecting cup is spaced from at least one LED and its adjacent hole to reflect light from the LEDs through the holes so each alphanumeric indicium is visible from the front side 114 of the PCB 110.

It is noted that, in addition to the illumination devices shown as the LEDs 156-172, other electronic components may be mounted to the rear side 115 of the PCB 110. For example, one or more components such as capacitors, resistors, connectors, and the like, may be mounted to the rear side 115 of the PCB 110 for operating touch circuits or illumination devices.

With regard to the operation of the alphanumeric display assembly 100, each LED and corresponding hole may be confined within the space formed by the three dimensional wall of the corresponding light cup. When each LED is selectively activated, the light from each LED may be supplied toward a wall of the light cup and then reflected by the wall toward the hole. Some of the reflected light may pass through the hole without being retarded by any light blocking medium. The reflected light may further pass through the thickness of the PCB 110 to reach to the user. It may be understood that the intensity and area of the reflected illumination through the hole may be determined by at least one of the location of the LED relative to the light cup, the geometrical parameters of the light cup, the size and location of the hole and the thickness of the PCB.

While described above in the context of a seven-segment display, the PCB 110 may include other arrangements of holes along with corresponding LEDs and associated light cups to produce other alphanumeric displays. Typical alphanumeric displays include seven-segment displays, nine-segment displays, fourteen-segment display and sixteen segment displays. As with the holes 132, 134 arranged to form a colon, the PCB 110 may include other holes along with corresponding LEDs and associated light cups to produce additional symbols. Typical symbols associated with segmented displays include the colon, the comma and the decimal point. Multiple alphanumeric displays may be configured to act as a single display units. For example, as shown in the figures, three seven segment displays may form a single display unit.

By provision of a light cup or a light reflector with an array of light cups, the alphanumeric display assembly may achieve a desirably bright output light intensity by direct reflection of the light from an LED off the light cup and through the hole in the PCB. The light reflector may be manufactured in a cost efficient manner that far exceeds alternative methods. For example, encapsulation of the LED with a resin to serve as a waveguide to direct the light through the hole may be costly and time-consuming and may result in a less appealing or less bright display over time as the encapsulant ages and discolors.

Figure 4:
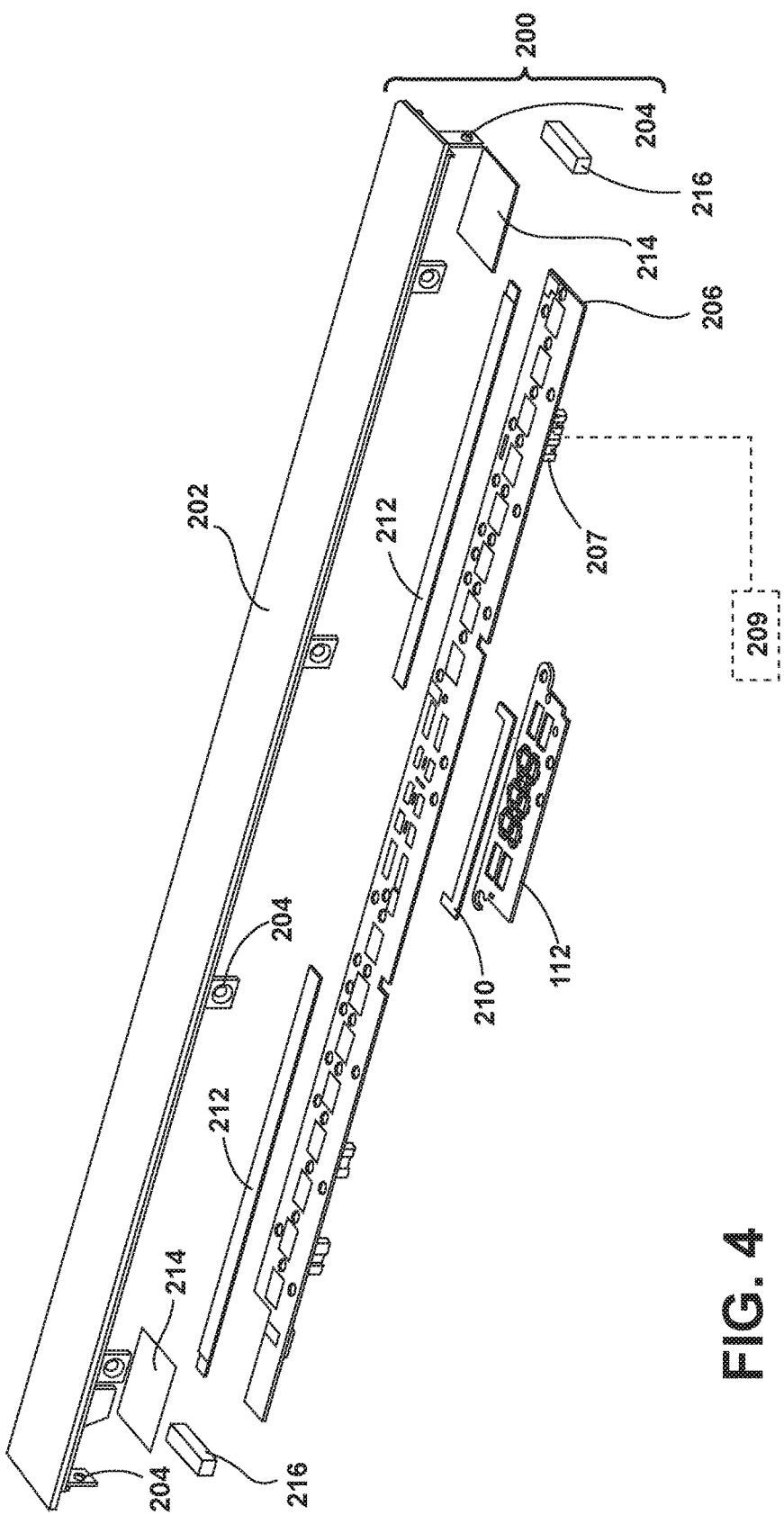
FIG. 4 is an exploded view of a fascia assembly that includes a display assembly of a type according to FIG. 1.

An embodiment of a display assembly is shown in FIG. 4, where it may be incorporated into a fascia assembly 200 for a device, such as an appliance. The fascia assembly 200 includes some sort of fascia 202, which may be an in-mold label, an in-mold decoration, printed glass, or the like. The fascia 202 is light transmissive, such that it allows light to be transmitted through it or at least through portions thereof. Light transmissive portions may be transparent or translucent. Translucent portions may be filtered by adding layers or may be integral with a structure such as glass. Portions of the fascia 202 may be tinted. The fascia 202 may include indicia, some of which may represent user-selectable parameters, and may also included buttons or other tactile devices associated with the indicia. The fascia 202 includes tabs 204 for mounting the fascia assembly 200 to a device or to a console for a device.

The fascia assembly 200 includes a PCB 206 attached to a rear surface of the fascia 202. The PCB 206 may include a number of components such as capacitors, resistors, connectors, and the like for operating touch circuits or illumination devices, and have a wiring harness 207 for attachment to a controller or power source 209 in a device. The PCB 206 may include holes and LED's as in the embodiment of FIGS. 1-3, or it may include a single opening so that a display assembly 100 may be mounted and connected to the PCB 206 or to the wiring harness and be visible through the fascia 202 and the opening. In the former case, the light reflector 112 as described above, may be attached to a rear surface of the PCB by, for example an adhesive 210. The PCB 206 may be attached to the fascia 202 by pressure sensitive adhesives 212, sealant tapes 214, or any other well-known fastening means, and may also include one or more force absorbing means, such as foam blocks 216 and the like.

Figure 5:
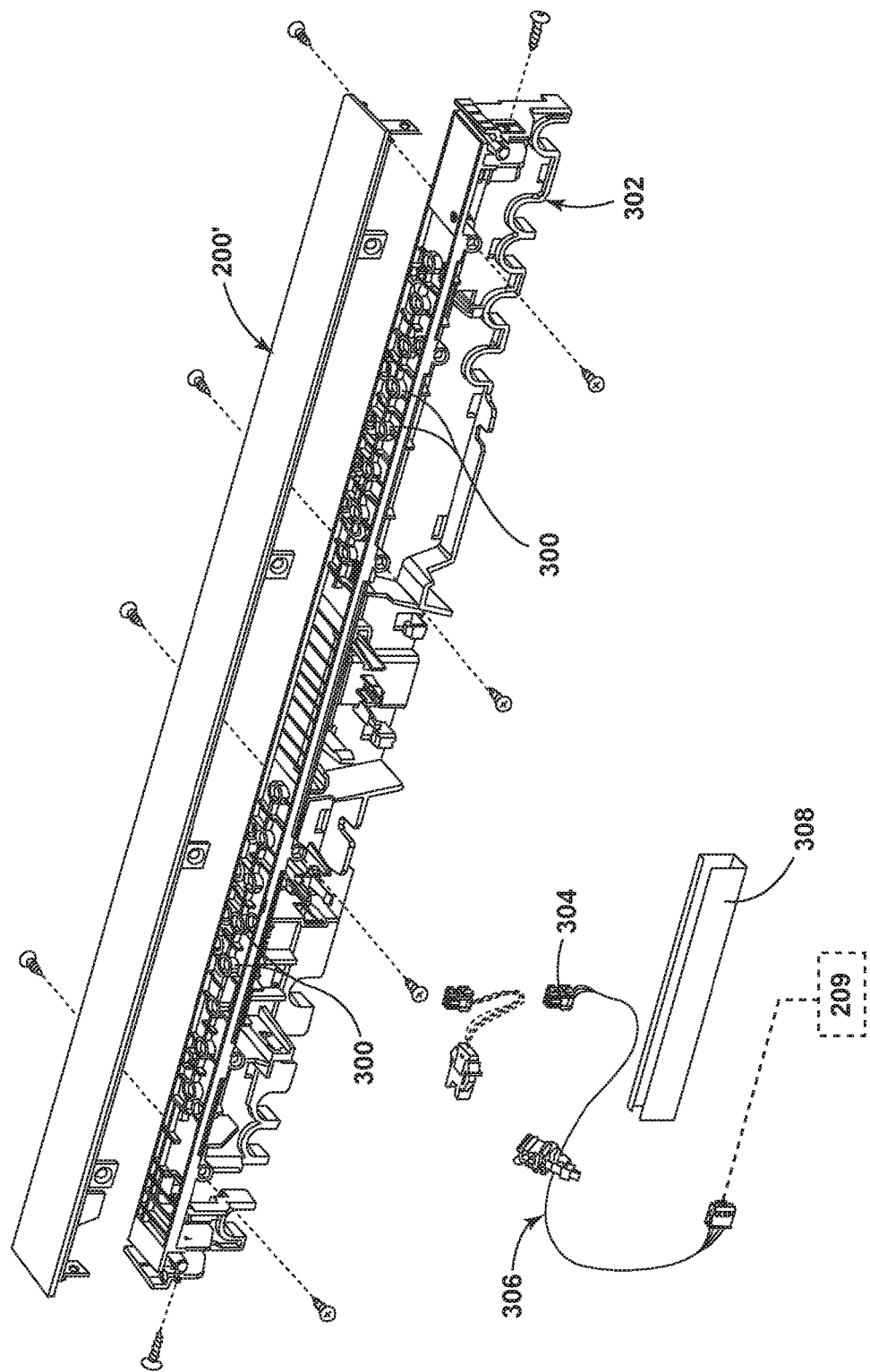
FIG. 5 is an exploded view of another embodiment with the display assembly incorporated in to the appliance console.

A further embodiment of the display assembly of FIG. 4 is shown in FIG. 5, which includes a fascia assembly 200' as described above, but without the light reflector 112. Instead, a plurality of light cups 300 are integrated with a console part 302 to which the fascia assembly 200 is attached. The console part 302 may be formed of a molded polymer such ABS, PP, PC, PS, FR ABS, PVC, FR PC-ABS, or the like, or it may be separately assembled as part of an appliance or other device. The console part 302 may be body of a device or a part thereof. It is contemplated that every device having a display assembly will have some body thereof to which the display assembly is associated. Rather than a separate light reflector mounted to the display assembly as disclosed above, benefits of incorporating the light cups 300 in the console part 302 become apparent, including ease of manufacture, lower cost, fewer parts, and lighter weight. The light cups 300 are preferably arranged on the console part 302 such that each light reflecting cup covers at least one LED and an adjacent hole in the PCB 206 attached to the fascia 202. As with the light reflector 112, the light cups 300, or a surface of the console part 302 containing the light cups 300 may be coated in whole or in part with one or more reflective materials that may include sputtered aluminum powder, silver coating, silkscreen, metal deposition, reflective paint, etc.

The console part 302 may include one or more connecters 304 to a wiring harness 306, which connecters will electrically couple with the PCB 206. The connecters 304 and wiring harness 306 may be electromagnetically shielded by a metallic covering 308 or the like.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure. As examples, the shape and geometrical dimension of light cups or holes may be varied to provide controlled illumination to the user. Each light cup may be individually shaped relative to the PCB to cover a single hole and adjacent LED. In the context of the light cups integrated into a device component such as a console, the console may be a separate component of the device or it may be integral with the device itself. The light cups may have additional reflective properties added, such as a polished surface, a metallic surface, a colored surface, and/or a surface formed to reflect light a given wavelength.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A display assembly, comprising:
   a controller;
   a fascia assembly having a fascia having a front surface and a rear surface and where the fascia is configured to be light transmissive, a printed circuit board (PCB) mounted to the rear surface of the fascia and the PCB including a plurality of holes extending through a surface thereof between a front side and a rear side of the surface, and a plurality of light emitting diodes (LEDs) mounted to the rear side, wherein at least one LED is mounted adjacent to each of the plurality of holes;
   a wiring harness coupling the controller to the PCB wherein the LEDs may be energized according to signals received from the controller; and
   a console adjacent the PCB and having a body having a length extending along the fascia and defining a front surface with a plurality of integrated light reflecting cups, where the light reflecting cups are integrated on a front surface of the body and each of the plurality of light reflecting cups are configured to cover at least one of the plurality of LEDs and at least one of the adjacent holes, and is spaced from the at least one LED and the at least one of the adjacent holes to reflect light from the at least one of the plurality of LEDs through the at least one of the adjacent holes so that the light is visible through the fascia assembly;
   wherein the fascia is configured to be mounted to the console and the console is configured to provide support for the fascia assembly.

2. The display assembly according to claim 1, further comprising a light reflector in each light reflecting cup.

3. The display assembly according to claim 2 wherein the console is a molded thermoplastic.

4. The display assembly according to claim 3 wherein the holes and LEDs are arranged as alphanumeric indicia.

5. The display assembly according to claim 4 wherein the alphanumeric indicia is formed of seven holes arranged for a seven segment display.

6. The display assembly according to claim 5, further comprising at least three seven segment alphanumeric indicia.

7. The display assembly according to claim 1 wherein the console is formed of one of acrylonitrile butadiene styrene (ABS), polypropylene (PP) or polycarbonate (PC).

8. The display assembly according to claim 1 wherein the console is formed of one of flame retardant acrylonitrile butadiene styrene (FR ABS), Polyvinyl Chloride (PVC), or flame retardant polycarbonate/ acrylonitrile butadiene styrene (FR PC-ABS).

9. A console assembly for an appliance, the console assembly comprising:
   a fascia assembly, comprising;
      a fascia having a front surface and a rear surface and where the fascia is configured to be light transmissive and where the fascia includes at least one tab; and
      a PCB operably coupled to the rear surface of the fascia;
   a console body having a length and defining a front surface with a plurality of light reflecting cups integrally formed in the front surface and arranged as indicia along at least a portion of the length; and
   a wiring connector adapted to couple the PCB to a controller in the appliance;
   wherein the tab of the fascia is configured to be mounted to the console body and the console body is configured to provide support for the fascia assembly, wherein when the fascia is mounted to the console body each light reflecting cup is positioned to cover an LED and an adjacent hole in the PCB of the fascia assembly when the fascia assembly is mounted adjacent the console.

10. The console assembly according to claim 9, further comprising a light reflector in each light reflecting cup.

11. The console assembly according to claim 9 wherein the console is a molded thermoplastic.

12. The console assembly according to claim 9 wherein the indicia is alphanumeric.

13. The console assembly according to claim 12 wherein the alphanumeric indicia is formed of seven holes arranged for a seven segment display.

14. The console assembly according to claim 13, further comprising at least three seven segment alphanumeric indicia.

15. The console assembly according to claim 9 wherein the console is formed of one of acrylonitrile butadiene styrene (ABS), polypropylene (PP) or polycarbonate (PC).

16. The console assembly according to claim 9 wherein the console is formed of one of flame retardant acrylonitrile butadiene styrene (FR ABS), Polyvinyl Chloride (PVC), or flame retardant polycarbonate/ acrylonitrile butadiene styrene (FR PC-ABS).

17. A display assembly, comprising:
   a fascia assembly, comprising:
      a fascia having a front surface and a rear surface and where the fascia is configured to be light transmissive and where the fascia includes at least one mounting projection; and
      a printed circuit board operably coupled to the rear surface of the fascia, the printed circuit board including a substrate with a plurality of holes extending there through between a front side and a rear side of the substrate, and a plurality of light emitting diodes mounted to the rear side, wherein at least one of the plurality of the light emitting diodes is mounted adjacent to each of the plurality of holes; and
   a console having a body having a length, and defining a front surface with a plurality of integrated light reflecting cups and where the at least one mounting projection is operably coupled to the body and wherein the light reflecting cups are integrated on the front surface of the body so that each of the plurality of light reflecting cups covers at least one of the plurality of the light emitting diodes and one of the plurality of holes, and is spaced from the at least one of the plurality of the light emitting diodes and the one of the plurality of holes to reflect light from the at least one of the plurality of the light emitting diodes through the one of the plurality of holes so that the light is visible through the fascia assembly.

18. The display assembly of claim 17 wherein the console is configured to receive the at least one mounting projection.

19. The display assembly of claim 18 wherein the fascia comprises a set of mounting projections and the console is configured to receive the set of mounting projections.

* * * * *